(12) United States Patent
Yoshida (10) Patent No.: US 6,674,101 B2
(45) Date of Patent: Jan. 6, 2004

(54) GAN-BASED SEMICONDUCTOR DEVICE

(76) Inventor: Seikoh Yoshida, c/o The Furukawa Electric Co., Ltd., 6-1, Maranouchi 2-chome, Chiyoda-ku, Tokyo (JP)

( * ) Notice: Subject to any disclaimer, the term of this patent is extended or adjusted under 35 U.S.C. 154(b) by 0 days.

(21) Appl. No.: 10/150,042

(22) Filed: May 15, 2002

(65) Prior Publication Data

US 2002/0182791 A1 Dec. 5, 2002

(30) Foreign Application Priority Data

Jun. 1, 2001 (JP) ........................................ 2001-167265

(51) Int. Cl.[7] .............................................. H01L 29/778
(52) U.S. Cl. ........................ 257/194; 257/263; 257/330; 257/331
(58) Field of Search ................. 257/194, 263, 257/330, 331

(56) References Cited

U.S. PATENT DOCUMENTS 5,436,474 A * 7/1995 Banerjee et al. ............ 257/194
6,207,977 B1 * 3/2001 Augusto ..................... 257/192

* cited by examiner

*Primary Examiner*—Jerome Jackson
(74) *Attorney, Agent, or Firm*—Knobbe, Martens, Olson & Bear, LLP (57) ABSTRACT

A GaN-based semiconductor device made of GaN-based semiconductor materials includes a bank made of a first undoped material and formed on a base layer, a thin layer made of a second undoped material having higher band-gap energy than the first undoped material and formed on a side wall surface of the bank, the thin layer having a heterojunction with the first undoped material, a source electrode formed on the bank so as to extend beyond the heterojunction between the bank and the thin layer, and a drain electrode formed on the reverse surface of the base layer, wherein a two-dimensional electron gas layer is formed between the source and drain electrodes in parallel with the heterojunction.

8 Claims, 6 Drawing Sheets

FIG. 1

(PRIOR ART)

GAN-BASED SEMICONDUCTOR DEVICE

BACKGROUND OF THE INVENTION

1. Field of the Invention

The present invention relates to a GaN-based semiconductor device, and more particularly, to a GaN-based semiconductor device having a novel layered structure and suited for use as a high-electron mobility transistor (HEMT), a field-effect transistor (FET), etc.

2. Description of the Related Art

GaN-based semiconductor materials, such as GaN, InGaN, AlGaN and AlInGaN, have high band-gap energy as well as high dielectric breakdown field strength, compared with Si-based or GaAs-based materials, for example. Also, GaN-based materials ensure superior high-temperature operation and have high electron saturation velocity.

Currently, therefore, diligent study and development of electronic devices using GaN-based materials, such as HEMT and FET, are under way, and because of the above superior characteristics, GaN-based materials are attracting attention as a useful material for power devices handling microwave or milliwave band. Namely, researches and development of novel small-sized, high reliability, low-loss devices using GaN-based materials are in progress, and it is essential for this type of semiconductor devices to have high gate-drain breakdown voltage, increased current density of operating layer and low-resistance contact electrodes.

Figure 1:
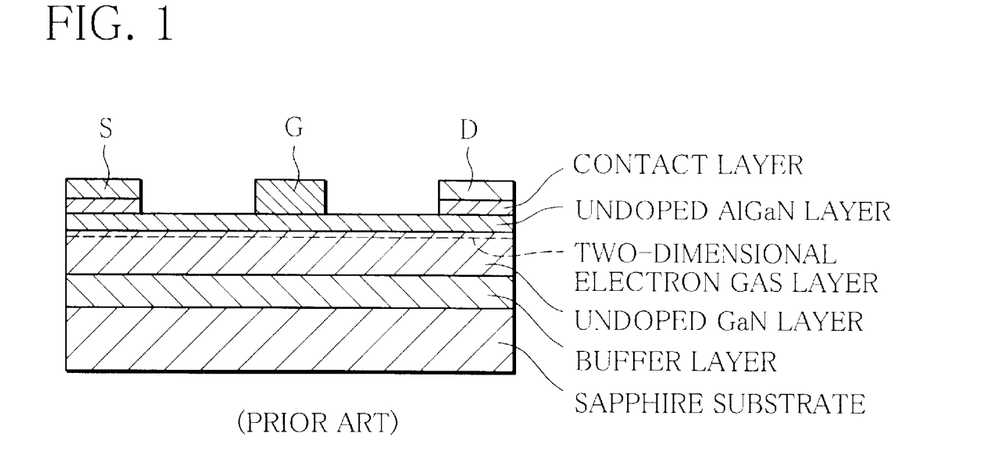
FIG. 1 is a sectional view showing an example of a conventional HEMT structure.

A GaN-based HEMT structure shown in FIG. 1, for example, is conventionally known. As illustrated, the conventional HEMT has a layered structure wherein a buffer layer of GaN, an undoped GaN layer and an undoped AlGaN layer are successively formed on a semi-insulating substrate of sapphire, for example. A source electrode S and a drain electrode D are formed on the surface of the undoped AlGaN layer so as to establish ohmic contact with a contact layer of, for example, Si-doped GaN therebetween. Also, a gate electrode G is formed on the surface of the undoped AlGaN layer at a location between the source and drain electrodes.

In the HEMT having such a structure, a piezoelectric field is produced due to a piezoelectric effect attributable to crystal strain at the boundary between the undoped GaN layer and the undoped AlGaN layer, the latter being constituted by compound crystal, with the result that a two-dimensional electron gas layer is formed directly under the heterojunction between the two layers.

While the source and drain electrodes S and D are in operation, the undoped AlGaN layer functions as an electron supply layer and supplies electrons to the undoped GaN layer. The electrons thus supplied travel at high speed to the drain electrode D by the action of the two-dimensional electron gas layer formed at the uppermost region of the undoped GaN layer. At this time, the gate electrode G is operated to form a depletion layer directly thereunder, thus enabling the device to accomplish various modulating operations.

SUMMARY OF THE INVENTION

In a preferred embodiment of the present invention, a GaN-based semiconductor device comprises: a base layer made of a GaN-based semiconductor material and having first and second surfaces; a bank made of a GaN-based first undoped semiconductor material and formed on the first surface of the base layer, the bank having a side wall surface and an upper surface; a thin layer made of a GaN-based second undoped semiconductor material having higher band-gap energy than the first undoped semiconductor material and formed on the side wall surface of the bank, the thin layer having a heterojunction with the first undoped semiconductor material; a first insulating layer formed on the first surface of the base layer; a gate electrode formed on the first insulating layer so as to be in contact with the thin layer; a second insulating layer formed on the gate electrode; a source electrode formed on the upper surface of the bank so as to extend beyond the heterojunction between the bank and the thin layer; and a drain electrode formed on the second surface of the base layer.

The bank formed on the first surface of the base layer may be one in number; alternatively, a plurality of banks may be formed. In order to permit heavy current to pass, however, multiple banks are preferably formed because, in this case, more two-dimensional electron gas layers can be formed.

According to another preferred embodiment of the present invention, a GaN-based semiconductor device comprises: a base layer made of a GaN-based semiconductor material and having first and second surfaces; a plurality of banks made of a GaN-based first undoped semiconductor material and formed on the first surface of the base layer, each of the banks having side wall surfaces on both sides thereof and an upper surface, those side wall surfaces of adjacent ones of the banks which face each other defining a U-shaped trench in cooperation with the first surface of the base layer; a thin layer made of a GaN-based second undoped semiconductor material having higher band-gap energy than the first undoped semiconductor material and formed on each of the facing side wall surfaces of the adjacent banks, the thin layer having a heterojunction with the first undoped semiconductor material; a first insulating layer formed on the first surface of the base layer in each of the U-shaped trenches; a gate electrode formed on the first insulating layer in each of the U-shaped trenches so as to be in contact with the thin layers facing each other; a second insulating layer formed on the gate electrode in each of the U-shaped trenches; a plurality of source electrodes each formed on the upper surface of a corresponding one of the banks so as to extend up to intermediate portions of the thin layers on both sides of the corresponding bank; and a drain electrode formed on the second surface of the base layer.

Each of the banks may extend in a straight line on the first surface of the base layer or may have a circular or rectangular or some other form as viewed from above the first surface. Also, the side wall surfaces of each bank may be either perpendicular to or inclined with respect to the first surface of the base layer.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION

Embodiments of the invention will now be described with reference to the accompanying figures, wherein like reference numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

Figure 2:
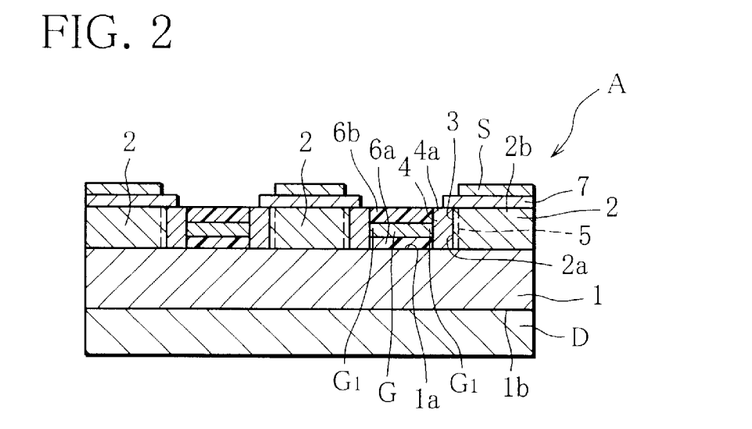
FIG. 2 is a sectional view of a GaN-based semiconductor device according to one embodiment of the present invention.

FIG. 2 shows an example A of a GaN-based semiconductor device according to the present invention.

The device A comprises a base layer 1 having an upper surface (first surface) 1a and a lower surface (second surface) 1b. A plurality of (in the figure, three) elongate banks 2, which are made of a first undoped material and each have a rectangular cross section, are formed on the upper surface 1a and extend in the same direction (see FIG. 4). A plurality of (in the figure, two) U-shaped trenches 3 are formed between the banks 2, each trench 3 being defined by side wall surfaces 2a of the adjacent banks 2 and the upper surface of the base layer 1 and having a depth reaching the upper surface 1a.

The base layer 1 and the banks 2 are each made of a GaN-based semiconductor material; however, the base layer 1 is made of n-GaN doped, for example, with Si, which is an n-type impurity, at a doping concentration of $1 \times 10^{17}$ to $5 \times 10^{19}$ $cm^{-3}$, while the first undoped material constituting the banks 2 is an undoped GaN. The material of the base layer 1 is not particularly limited, but other preferred dopants for the base layer 1 than Si include n-type impurities such as Sn and Te.

A thin layer 4 made of a second undoped material is formed on each of the side wall surfaces 2a in the individual trenches 3 and constitutes a heterojunction with the first undoped material of the banks 2.

For the second undoped material, a material having higher band-gap energy than the first undoped material is used. Where the first undoped material is undoped GaN, for example, the second undoped material may be AlGaN, AlInGaN, AlGaNAs, AlGaNP or AlInGaNAsP, for example, each of which has higher band-gap energy than GaN.

As a consequence, a two-dimensional electron gas layer 5 is formed in each bank 2 in the vicinity of its side wall surface 2a (which also constitutes the heterojunction between the first and second undoped materials). The two-dimensional electron gas layer 5 extends vertically from the upper surface to the lower surface of each bank 2, as shown in FIG. 2.

The thin layer 4 made of the second undoped material preferably has a thickness of about 20 to 30 nm. By setting the thickness to this range, it is possible to form a two-dimensional electron gas layer with a carrier density of as high as $5 \times 10^{18}$ to $5 \times 10^{19}$ $cm^{-3}$ at a distance of about 1 to 2 nm from the heterojunction.

Further, in the device A, a first insulating layer 6a, a gate electrode G and a second insulating layer 6b are successively formed in the order mentioned, on the upper surface 1a of the base layer 1 so as to fill in the remaining space of each U-shaped trench 3 having the thin layers 4 formed therein. Thus, the gate electrode G is shielded for electrical insulation by the upper and lower insulating layers. Also, both side edges $G_1$, $G_1$ of the gate electrode G are disposed in contact with the respective thin layers 4 made of the second undoped material, to enable the device to perform modulating operation.

A contact layer 7 is formed on the upper surface 2b of each bank 2 in a manner such that the contact layer extends beyond the heterojunction 2a between the bank 2 and each thin layer 4 up to an intermediate portion of the upper surface 4a of the thin layer 4. A source electrode S is formed on the contact layer 7.

In the case where the source electrode S is made of a material capable of ohmic contact with both the bank 2 and the thin layer 4, the contact layer 7 may be omitted and the source electrode S may be formed directly on the upper surfaces of the bank and thin layers. Even in this case, the source electrode S must be formed so as to extend beyond the heterojunctions 2a.

A drain electrode D is formed over the entire lower or reverse surface 1b of the base layer 1.

The device A shown in FIG. 2 has four vertically extending two-dimensional electron gas layers 5 formed therein.

Namely, the device A is a single device and yet has four HEMT structures incorporated therein, each structure corresponding to the conventional device shown in FIG. 1.

Referring to one HEMT structure, while the source and drain electrodes S and D are in operation, electrons supplied from the thin layer 4 made of the second undoped material travel downward at high speed, by the action of the two-dimensional electron gas layer 5, to the drain electrode D through the base layer 1. The gate electrode G is then operated, whereupon the travel of electrons is modulated by a depletion layer formed in the thin layer 4 in the thickness direction thereof, thus providing an electric field effect.

In this manner, the supplied electrons flow toward the drain electrode mainly through a portion of the base layer 1 located beneath the bank. Accordingly, a region beneath the gate electrode, that is, a portion of the base layer 1 located under the gate electrode in FIG. 2, may be omitted or an insulator may be buried in the portion. In view of simplification of the manufacturing process, however, the structure shown in FIG. 2 is preferable in terms of practicality.

In the conventional HEMT structure shown in FIG. 1, the source electrode S, the gate electrode G and the drain electrode D are arranged on the same plane parallel with the heterojunction where the two-dimensional electron gas layer is formed. Consequently, even if an attempt is made to reduce the area of the device thereby to downsize the HEMT, the size of reducible area is naturally limited because a certain area needs to be secured for the electrodes.

Further, in the conventional HEMT structure, because of its electrode arrangement wherein the gate electrode intervenes between the source and drain electrodes, the ON-state resistance cannot be made significantly small since it is difficult to reduce the source-to-drain distance. Also, in order to prevent the electric field concentration at the edge of the drain electrode due to a massive flow of electrons from the source electrode to the drain electrode, it is necessary that the conventional structure should have an asymmetric structure such that the gate-drain distance is greater than the source-gate distance.

On the other hand, in the structure according to the present invention, the drain and source electrodes are arranged on opposite sides of the device along the current flow path and the drain electrode has no sharp edge like the conventional one. It is therefore less likely that the electric field concentration will be caused due to electrons flowing to the drain electrode, thus enhancing the reliability of the device in the case where the device is used as a power device applied with high voltage.

Also, in the device A according to this embodiment, a plurality of (in FIG. 2, four) HEMT structures are integrated on the same base layer 1, and thus the area required for one HEMT structure is smaller than in the case of the conventional structure shown in FIG. 1. Specifically, the device A can be reduced in size to half or less as compared with the conventional device, and it is probable in principle that the structure will be further reduced in size.

The device A can be produced in the manner described below.

Figure 3:
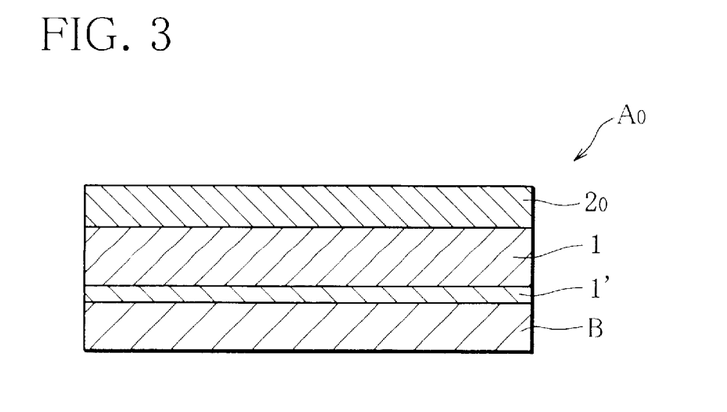
FIG. 3 is a sectional view of a slab substrate $A_0$ used in the production of the device shown in FIG. 2.

First, a substrate B for crystal growth, for example, a semi-insulating Si substrate, is prepared, and using an epitaxial crystal growth method such as GSMBE or MOCVD, a buffer layer $1'$ of GaN, a base layer 1, and a layer $2_0$ of a first undoped material are successively formed on the substrate B, thereby obtaining a slab substrate $A_0$ as shown in FIG. 3. For the substrate B, SiC, GaAs or sapphire may be used instead.

The material of the base layer 1 is not particularly limited, but n-GaN doped with an n-type impurity such as Si, Sn or Te, in particular, n-GaN doped with Si, is preferred as mentioned above.

The first undoped material forming the layer $2_0$ should be a GaN-based semiconductor material having lower band-gap energy than a second undoped material, mentioned later, and a suitable material is selected taking account of the second undoped material to be used. Preferably, undoped GaN is used as the first undoped material.

Figure 4:
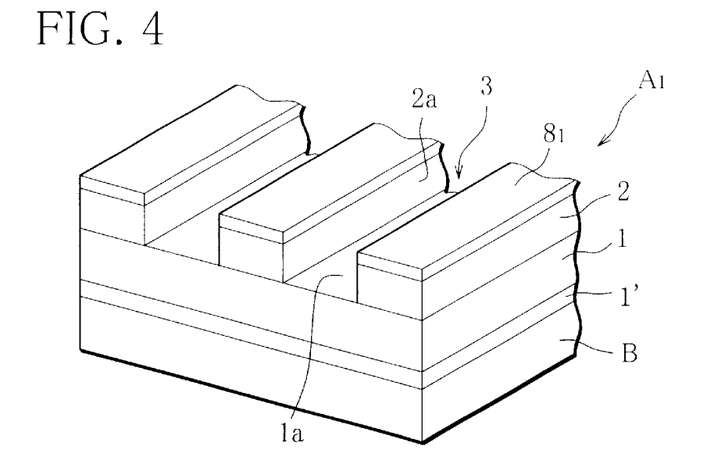
FIG. 4 is a perspective view showing part of a substrate $A_1$ having U-shaped trenches formed therein.

Subsequently, a mask $8_1$ of $SiO_2$, for example, is patterned on the surface of the layer $2_0$ of the slab substrate $A_0$ in regions corresponding to the upper surfaces of banks to be formed, and the remaining regions of the layer $2_0$ are removed by etching to an extent such that the surface $1a$ of the base layer 1 is exposed, by means of a dry etching system using ECR plasma, for example. As a consequence, a substrate $A_1$ shown in FIG. 4 is obtained which has a plurality of banks 2 made of the first undoped material and U-shaped trenches 3 of predetermined width located between the banks and having bottom surfaces constituted by the exposed surface $1a$ of the base layer 1.

Figure 5:
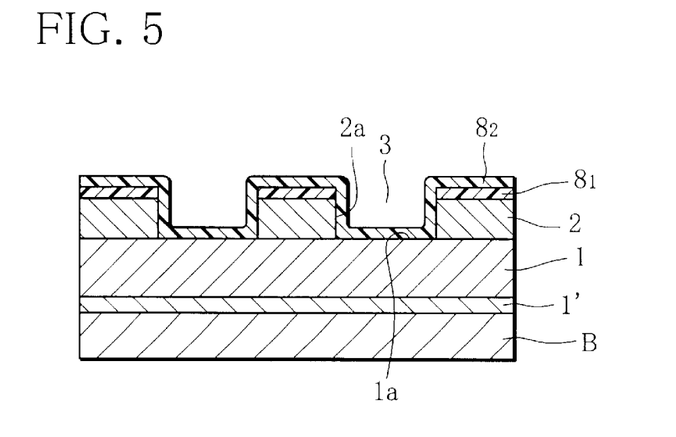
FIG. 5 is a sectional view showing a state in which an $SiO_2$ mask is formed on the entire upper surface of the substrate $A_1$ in the process of production of the device shown in FIG. 2.

Then, as shown in FIG. 5, a mask $8_2$ of $SiO_2$, for example, is formed on the entire upper surface of the substrate, thereby covering the exposed surface $1a$ of the base layer 1 and the side-wall surfaces $2a$ of the banks 2 with the mask. A resist is applied to surface regions of the mask $8_2$ located in the trenches 3 except for regions corresponding to the thickness of thin layers to be formed on the respective side wall surfaces $2a$ of the banks 2, and the regions with no resist applied thereto are removed by dry etching using ECR plasma, for example, to an extent such that the surface $1a$ of the base layer 1 is exposed.

Figure 6:
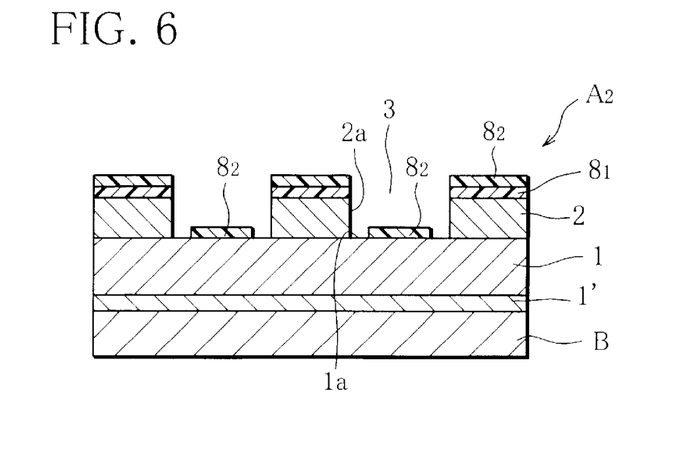
FIG. 6 is a sectional view of a substrate $A_2$ obtained in the process of production of the device shown in FIG. 2.

As a result, a substrate $A_2$ shown in FIG. 6 is obtained in which the side wall surfaces $2a$ of the banks 2 and regions of the surface $1a$ of the base layer 1 located in each U-shaped trench 3 are exposed while the remaining surface regions of the base layer 1 remain covered with the mask $8_2$. As the material of the mask, other chemically and thermally stable substances, such as $Al_2O_3$ or $SiN_x$, may be used instead.

Subsequently, the substrate $A_2$ is subjected to epitaxial lateral overgrowth (ELO) using a second undoped material. This selective growth is caused to take place in the openings of the mask, that is, on the side wall surfaces $2a$ of the banks 2 and the exposed surface regions of the base layer 1 located in the trenches 3, as seen from FIG. 6, and in this case, the selective growth progresses mainly in the lateral direction from the side wall surfaces. The selective growth technique is greatly advantageous in view of production process since the grown film need not be etched in a subsequent step.

The second undoped material used in this case should be a GaN-based semiconductor material having higher band-gap energy than the first undoped material forming the banks 2. Where the banks 2 are formed using GaN as the first undoped material, for example, AlGaN, AlInGaN, AlGaNAs, AlGaNP or AlInGaNAsP, each of which has higher band-gap energy than GaN, may be used as the second undoped material.

Figure 7:
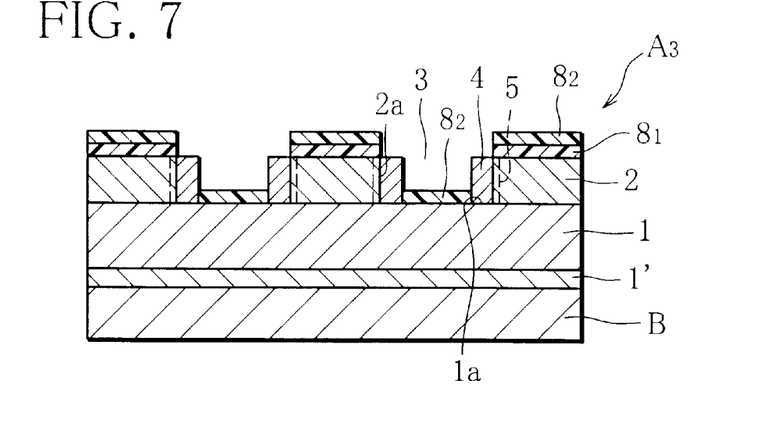
FIG. 7 is a sectional view of a substrate $A_3$, illustrating the formation of thin layers in the process of production of the device shown in FIG. 2.

As a consequence, a substrate $A_3$ shown in FIG. 7 is obtained in which thin layers 4 are formed on both sides of the remaining part of the mask $8_2$ in each trench and constitute a heterojunction with the side wall surfaces $2a$ of the respective banks as well as with the surface $1a$ of the base layer 1. Accordingly, the aforementioned two-dimensional electron gas layer 5 is formed in the vicinity of the heterojunction $2a$ such that the layer 5 vertically extends over the entire thickness of the bank 2 and reaches the base layer 1.

Figure 8:
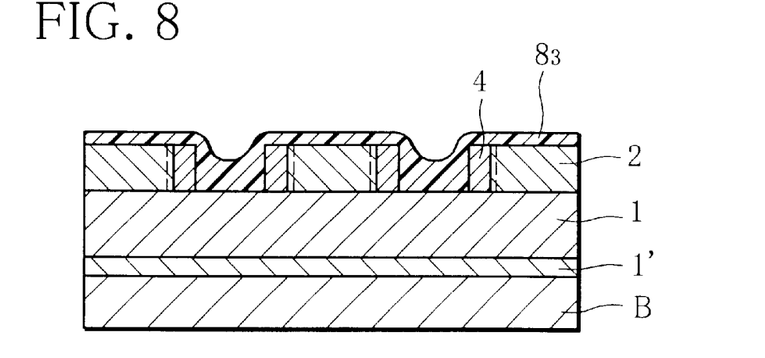
FIG. 8 is a sectional view showing a state in which the entire upper surface of the substrate $A_3$ is covered with an $SiO_2$ mask in the process of production of the device shown in FIG. 2.

Subsequently, the masks $8_1$ and $8_2$ are removed in their entirety by dry etching, for example, and the entire upper surface of the substrate is again covered with a mask $8_3$ of SiO$_2$ (FIG. 8).

Then, with a resist applied to the surface of the mask $8_3$ except for regions located between the thin layers 4 in the individual U-shaped trenches, the regions of the mask $8_3$ between the thin layers 4 are partly removed by etching. As a result, a substrate A$_4$ (FIG. 9) is obtained in which the U-shaped trenches have bottoms thereof covered with the mask $8_3$ of desired thickness. The mask $8_3$ functions as the first insulating layer 6a in the device A shown in FIG. 2.

Figure 10:
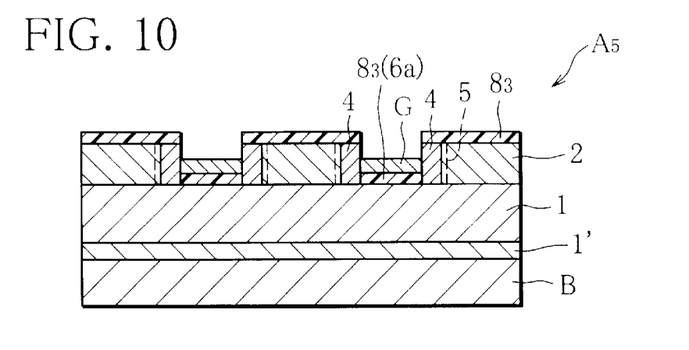
FIG. 10 is a sectional view of a substrate $A_5$, illustrating the formation of gate electrodes in the process of production of the device shown in FIG. 2.

Subsequently, Pt, for example, is deposited on the upper surface of the substrate A$_4$ to a desired thickness, and except the part of the Pt layer deposited on the first insulating layer 6a in each U-shaped trench, the Pt layer is lifted off. As a result, a substrate A$_5$ shown in FIG. 10 is obtained in which a gate electrode G of desired thickness having both side edges disposed in contact with the respective thin layers 4, 4 is formed on each of the first insulating layers 6a.

Figure 11:
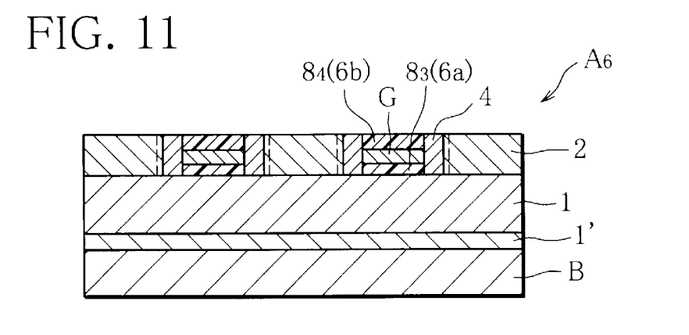
FIG. 11 is a sectional view of a substrate $A_6$ in which second insulating layers are formed to bury the gate electrodes in the process of production of the device shown in FIG. 2.

The entire upper surface of the substrate is then covered with a mask $8_4$ of SiO$_2$, for example, thereby filling SiO$_2$ in each recess and burying the gate electrode G, and the part of the mask formed on the banks 2 and the thin layers 4 is removed by etching to expose their upper surfaces. As a result, a substrate A$_6$ shown in FIG. 11 is obtained, wherein the upper surface of the substrate is flat as a whole with the upper surfaces of the banks 2 and the thin layers 4 exposed, and in each U-shaped trench are arranged the thin layers 4, 4 each forming a heterojunction with the side wall surface of the corresponding bank and the gate electrode G located between the thin layers and sandwiched between the masks $8_3$ and $8_4$ (insulating layers 6a and 6b).

Then, the upper surface of the substrate is patterned with a mask of SiO$_2$, for example, such that the mask partly covers the surface of each thin layer 4, and a contact layer of GaN, which is doped with, for example, Si at a high concentration to ensure low-resistance contact with the electrode, is selectively grown on the remaining part of the upper surface of the substrate, that is, on the surface of each bank 2 and part of the surfaces of the thin layers 4. The mask on the thin layers 4 is thereafter removed by etching.

Figure 12:
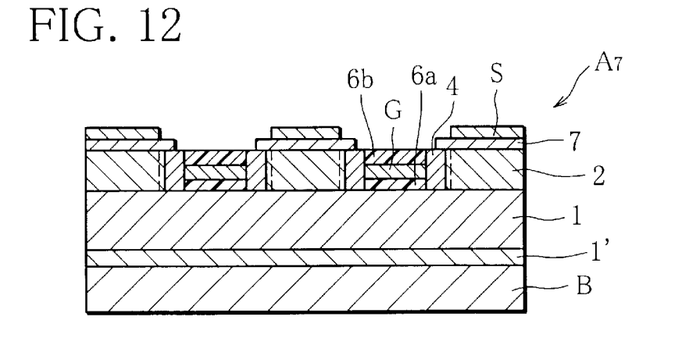
FIG. 12 is a sectional view of a substrate $A_7$, illustrating the formation of source electrodes in the process of production of the device shown in FIG. 2.

As a result, a substrate A$_7$ shown in FIG. 12 is obtained in which a source electrode S is formed on the upper surface of each bank 2 with the contact layer 7 interposed therebetween, the contact layer 7 extending beyond the heterojunction between the bank and each thin layer up to an intermediate portion of the upper surface of the thin layer. As mentioned above, the contact layer may be omitted if the material of the source electrode used provides excellent ohmic contact.

Figure 13:
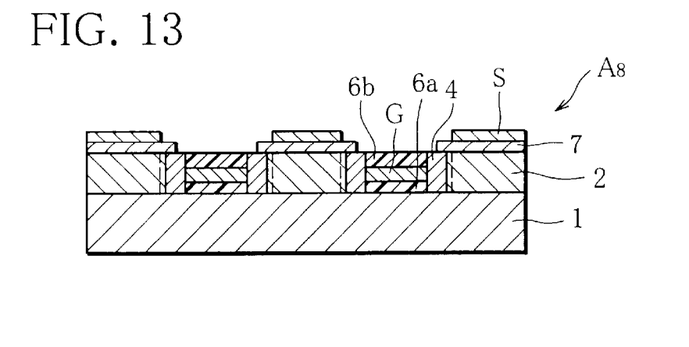
FIG. 13 is a sectional view of a substrate $A_8$ in which the reverse or lower surface of a base layer is exposed in the process of production of the device shown in FIG. 2.

Subsequently, the substrate B and the buffer layer 1' are removed by lapping, thereby obtaining a substrate A$_8$ shown in FIG. 13 in which the lower surface of the base layer 1 is exposed.

Finally, electrode materials of Al/Ti/Au, for example, are deposited on the lower surface of the base layer 1 of the substrate A$_8$ to form a drain electrode D, thereby obtaining the device A shown in FIG. 2.

The device A of FIG. 2 was actually fabricated in the manner described below.

First, using dimethylhydrazine ($5\times10^{-5}$ Torr=$6.7\times10^{-3}$ Pa) and metallic Ga ($5\times10^{-7}$ Torr=$6.7\times10^{-5}$ Pa), a GaN buffer layer 1' of 50 nm thick was grown on a semi-insulating Si substrate at a temperature of 640° C. by gas-source molecular beam epitaxy (GSMBE). Then, using ammonia ($5\times10^{-5}$ Torr=$6.7\times10^{-3}$ Pa), metallic Ga ($5\times10^{-7}$ Torr=$6.7\times10^{-5}$ Pa) and Si ($1\times10^{-8}$ Torr=$1.3\times10^{-6}$ Pa), an Si-doped GaN layer (n-type layer) 1 (doping concentration: $2\times10^{19}$ cm$^{-3}$) with a thickness of 2000 nm was grown on the GaN buffer layer 1' at a temperature of 850° C. by the same process. Further, an undoped GaN layer $2_0$ of 2 μm thick was grown on the Si-doped GaN layer 1 at a temperature of 850° C. by using ammonia ($5\times10^{-6}$ Torr=$6.7\times10^{-4}$ Pa) and metallic Ga ($5\times10^{-7}$ Torr=$6.7\times10^{-5}$ Pa), thereby obtaining the slab substrate A$_0$ shown in FIG. 3.

In this embodiment, the height (thickness) of the banks was set to 2 μm, so that the gate electrode G and the first and second insulating layers 6a and 6b had a total thickness of 2 μm, but the thickness values of these elements are not limited to these alone. Also, the thickness of the n-type layer 1 of the above embodiment was set to 2 μm, but the layer thickness is not limited to this value and may be reduced to shorten the time required for the production process.

The band-gap energy (Eg) of the aforementioned undoped GaN is about 3.4 eV.

Then, after the surface of the undoped GaN layer $2_0$ on the slab substrate A$_0$ was patterned with the mask $8_1$ of SiO$_2$, dry etching using ECR plasma was carried out to form U-shaped trenches 3 of 2 to 3 μm wide, at the bottom of which the surface 1a of the n-type layer 1 was exposed, thereby obtaining the substrate A$_1$ shown in FIG. 4.

Subsequently, the upper surface of the substrate A$_1$ was covered with the mask $8_2$ of SiO$_2$, and using ECR plasma, the bottom surfaces of the U-shaped trenches 3 were partly dry-etched to a depth reaching the surface 1a of the n-type layer 1, to create openings in the mask having a width of 30 nm from the side wall surface 2a of the corresponding bank 2, thereby obtaining the substrate A$_2$ shown in FIG. 6.

Then, using metallic Al ($1\times10^{-7}$ Torr=$1.3\times10^{-5}$ Pa), metallic Ga ($5\times10^{-7}$ Torr=$6.7\times10^{-5}$ Pa) and ammonia ($5\times10^{-6}$ Torr=$6.7\times10^{-4}$ Pa), thin layers 4 of undoped Al$_{0.2}$Ga$_{0.8}$N with a thickness of 30 nm were grown at a temperature of 850° C. by lateral selective growth, thereby obtaining the substrate A$_3$ shown in FIG. 7.

The band-gap energy (Eg) of the undoped Al$_{0.2}$Ga$_{0.8}$N is about 4.0 eV.

Figure 9:
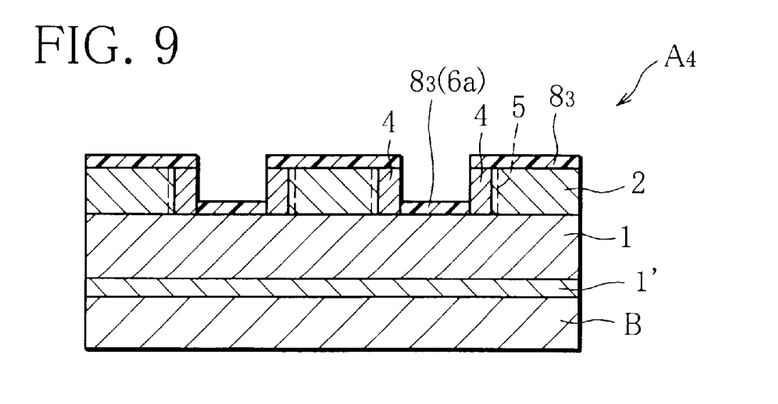
FIG. 9 is a sectional view of a substrate $A_4$, illustrating the formation of first insulating layers in the respective U-shaped trenches in the process of production of the device shown in FIG. 2.

Subsequently, the mask $8_3$ of SiO$_2$ was formed on the entire upper surface of the substrate A$_3$ (FIG. 8), and following the patterning using a resist, the regions of the SiO$_2$ mask located in the individual U-shaped trenches were partly removed by wet etching using buffered HF, to form first insulating layers 6a of 0.8 μm thick, thereby obtaining the substrate A$_4$ shown in FIG. 9.

Then, after Pt was deposited on the entire upper surface of the substrate A$_4$ to a thickness of 0.4 μm, the Pt layer was lifted off except for the regions deposited on the first insulating layers 6a, thereby obtaining the substrate A$_5$ (FIG. 10) having gate electrodes G. As for other gate electrode materials, Pt/Au,Pd/Au,Pt/Ti/Au,Ni/Ti/Au,Pt/Ni/Au,Pt/Ni/Ti/Au and so forth can be used.

The mask $8_4$ of SiO$_2$ was formed on the entire upper surface of the substrate A$_5$, thereby burying the gate electrodes G, and the SiO$_2$ mask was partly removed by wet etching, thereby obtaining the substrate A$_6$ shown in FIG. 11. The mask can of course be removed by dry etching instead.

Subsequently, a mask of SiO$_2$ was formed over the entire upper surface of the substrate A$_6$ and was patterned to create openings through each of which the bank 2 and part of the thin layers 4 were exposed. Then, using metallic Ga ($5\times10^{-7}$ Torr), metallic Si ($1\times10^{-8}$ Torr) and ammonia ($5\times10^{-6}$ Torr), a contact layer 7 (Si doping concentration: $2\times10^{19}$ cm$^{-3}$) with a thickness of 100 nm was grown in each of the openings at a temperature of 850° C. by selective growth. A source electrode S was then formed by successive deposition of Al/Ti/Au on each of the contact layers 7, thereby obtaining the substrate $A_7$ shown in FIG. 12.

The substrate $A_7$ was then lapped such that the reverse or lower surface of the n-type layer 1 was exposed, and a drain electrode D was formed by successive deposition of Al/Ti/Au on the exposed surface, thereby producing the device A of the present invention. As for other ohmic contact electrode materials, Ta—Si/Au,Al—Si/Au,Ti—Si/Au and so forth can be used.

The device A fabricated in this manner had a maximum threshold current value of 30 A, and in this case, showed an ON-resistance of 10 m$\Omega$cm$^2$ and a breakdown voltage exceeding 300 V.

In the foregoing embodiment, undoped $Al_{0.2}Ga_{0.8}N$ was used as the second undoped material, but similar effects can be obtained insofar as the undoped AlGaN used satisfies a general formula: $Al_xGa_{1-x}N$ ($0<x\leq1$). A material with a greater value of the index x shows higher band-gap energy than undoped GaN. For example, in the case of AlN wherein x=1, its band-gap energy is approximately 6.2 eV.

Figure 14:
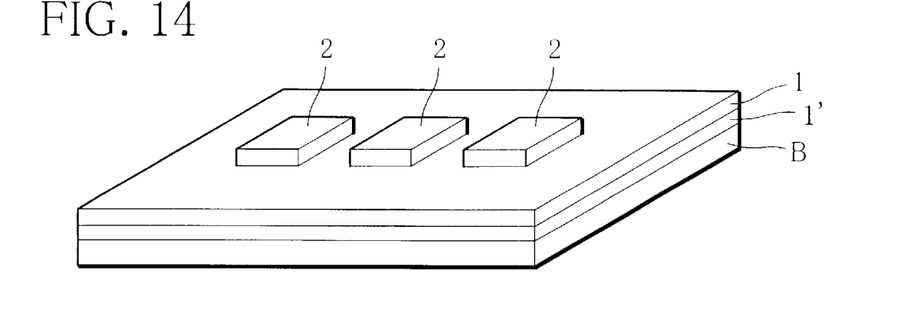
FIG. 14 is a perspective view showing another exemplary device provided with three banks, each of which has a rectangular form as viewed from above the upper surface of the device.
Figure 15:
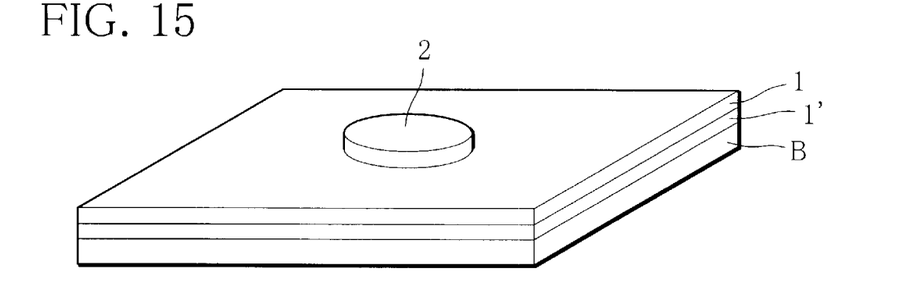
FIG. 15 is a perspective view showing still another exemplary device provided with a single bank, which has a circular form as viewed from above the upper surface of the device.

Each of the banks may extend in a straight line as mentioned above, or may have a rectangular form or circular form as viewed from above the upper surface of the n-type layer 1, as shown in FIGS. 14 and 15, respectively. In the embodiment shown in FIG. 14, three rectangular banks are arranged side by side on the first surface of the n-type layer 1.

Figure 16:
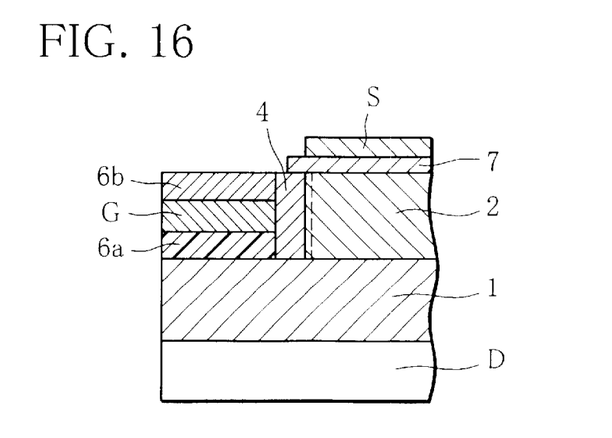
FIG. 16 is a sectional view of a device in which a two-dimensional electron gas layer is formed in only one of the side wall surfaces of a bank.

The GaN-based semiconductor device of the present invention may alternatively have a single HEMT structure indicated by circle P in FIG. 2, as shown in the conceptual diagram of FIG. 16. With the construction of this embodiment, the semiconductor device can be reduced in size and also be made very thin.

Figure 17:
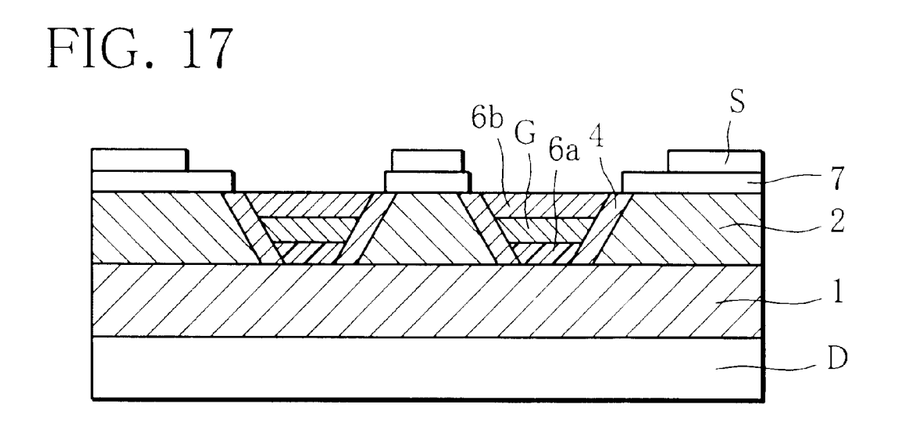
FIG. 17 is a sectional view showing an exemplary device in which the side wall surfaces of the banks are inclined at about 60 degrees.
Figure 18:
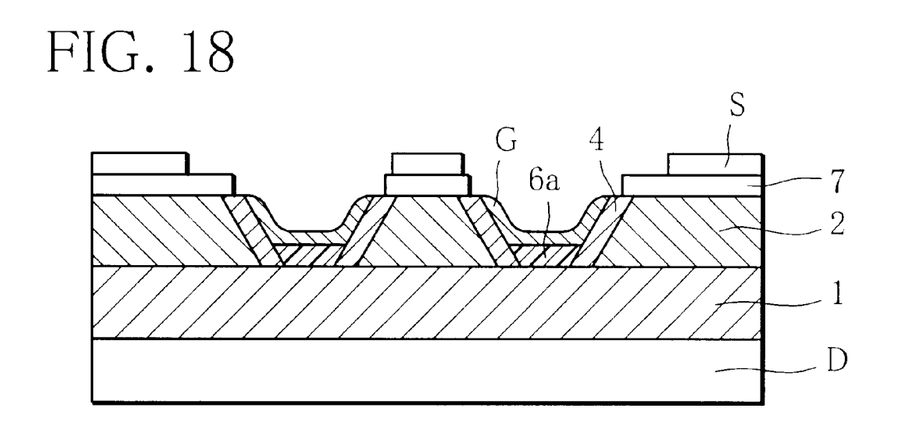
FIG. 18 is a sectional view showing a further exemplary device in which the side wall surfaces of the banks are inclined at about 60 degrees.

The side wall surfaces of each bank may not necessarily be perpendicular (inclination: 90 degrees) to the upper surface 1a of the n-type layer 1 and may be inclined by employing a suitable dry etching process. An example of such a device having banks with inclined side wall surfaces is shown in FIG. 17. In the device shown in the figure, the side wall surfaces have an inclination of about 60 degrees, but the inclination can be made even gentler by changing the dry etching conditions. Another example is shown in FIG. 18. By thus making the inclination gentle, it is possible to facilitate the lateral selective growth of the second undoped material on the first undoped material and the forming of the gate electrode G on the second undoped material.

As is clear from the foregoing description, the GaN-based semiconductor device according to the present invention has operating electrodes arranged in a vertical or thickness direction thereof and also has a number of U-shaped trenches formed therein, permitting a large number of HEMT structures to be integrated on a single device. Compared with semiconductor devices with the conventional structure, therefore, the semiconductor device of the present invention is capable of passing heavy current for operation.

Also, since a large number of HEMT structures can be incorporated in a small area, the overall size of the device can be reduced.

What is claimed is:

1. A GaN-based semiconductor device comprising:
   a base layer made of a GaN-based semiconductor material and having first and second surfaces;
   a bank made of a GaN-based first undoped semiconductor material and formed on the first surface of said base layer, said bank having a side wall surface and an upper surface;
   a thin layer made of a GaN-based second undoped semiconductor material having higher band-gap energy than the first undoped semiconductor material and formed on the side wall surface of said bank, said thin layer having a heterojunction with the first undoped semiconductor material;
   a gate electrode formed in contact with said thin layer;
   a source electrode formed on the upper surface of said bank so as to extend beyond the heterojunction between said bank and said thin layer; and
   a drain electrode formed on the second surface of said base layer.

2. The GaN-based semiconductor device according to claim 1, further comprising a first insulating layer formed on the first surface of said base layer and a second insulating layer formed on said gate electrode, said gate electrode being formed on said first insulating layer so as to be in contact with said thin layer.

3. A GaN-based semiconductor device comprising:
   a base layer made of a GaN-based semiconductor material and having first and second surfaces;
   a plurality of banks made of a GaN-based first undoped semiconductor material and formed on the first surface of said base layer, each of said banks having side wall surfaces on both sides thereof and an upper surface, those side wall surfaces of adjacent ones of said banks which face each other defining a U-shaped trench in cooperation with the first surface of said base layer;
   a thin layer made of a GaN-based second undoped semiconductor material having higher band-gap energy than the first undoped semiconductor material and formed on each of the facing side wall surfaces of said adjacent banks, said thin layer having a heterojunction with the first undoped semiconductor material;
   a gate electrode formed in contact with said thin layers located on both sides thereof;
   a plurality of source electrodes each formed on the upper surface of a corresponding one of said banks so as to extend beyond the heterojunction between said corresponding bank and each of said thin layers located on both sides of said bank; and
   a drain electrode formed on the second surface of said base layer.

4. The GaN-based semiconductor device according to claim 3, further comprising a first insulating layer formed on the first surface of said base layer in each of said U-shaped trenches and a second insulating layer formed on said gate electrode in each of said U-shaped trenches, said gate electrode being formed on each of said first insulating layers so as to be in contact with said thin layers located on both sides thereof.

5. The GaN-based semiconductor device according to claim 1 or 3, wherein said bank extends in one direction on the first surface of said base layer and has the side wall surface extending in a longitudinal direction thereof.

6. The GaN-based semiconductor device according to claim 1 or 3, wherein said bank has a rectangular form as viewed from above the first surface of said base layer.

7. The GaN-based semiconductor device according to claim 1 or 3, wherein said bank is made of undoped GaN, and said thin layer is made of an undoped material selected from AlGaN, AlInGaN, AlGaNAs, AlGaNP and AlInGaNAsP.

8. The GaN-based semiconductor device according to claim 1 or 3, wherein said bank is made of undoped GaN, and said thin layer is made of an undoped material represented by $Al_xGa_{1-x}N$ ($0<x\leq1$).

* * * * *

UNITED STATES PATENT AND TRADEMARK OFFICE
CERTIFICATE OF CORRECTION

PATENT NO. : 6,674,101 B2
DATED : January 6, 2004
INVENTOR(S) : Seikoh Yoshida

It is certified that error appears in the above-identified patent and that said Letters Patent is hereby corrected as shown below:

<u>Title page,</u>
Insert Item -- [73] Assignee: The Furukawa Electric Co., Ltd, Tokyo, Japan --

Signed and Sealed this

Twenty-sixth Day of October, 2004

JON W. DUDAS
*Director of the United States Patent and Trademark Office*